(12) United States Patent  (10) Patent No.: US 9,188,771 B2
Dodoc et al.  (45) Date of Patent: Nov. 17, 2015

(54) REFLECTIVE OPTICAL IMAGING SYSTEM

(75) Inventors: Aurelian Dodoc, Heidenheim (DE);
Christoph Zaczek, Heubach (DE);
Sascha Migura, Aalen-Unterrombach (DE); Gerhard Braun, Ederheim (DE);
Hans-Juergen Mann, Oberkochen (DE); Hans-Jochen Paul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 653 days.

(21) Appl. No.: 13/313,641

(22) Filed: Dec. 7, 2011

(65) Prior Publication Data

US 2012/0224160 A1 Sep. 6, 2012

Related U.S. Application Data

(60) Provisional application No. 61/420,882, filed on Dec. 8, 2010.

(30) Foreign Application Priority Data

Dec. 8, 2010 (DE) .......................... 10 2010 062 597

(51) Int. Cl.
*G03B 27/68* (2006.01)
*G02B 17/06* (2006.01)

(52) U.S. Cl.
CPC .................................. *G02B 17/0657* (2013.01)

(58) Field of Classification Search
CPC ............ G03F 7/70958; G03F 7/70316; G03F 7/70308; G03F 7/70566
USPC ............................ 355/66, 43, 51, 57; 359/364
See application file for complete search history.

(56) References Cited

U.S. PATENT DOCUMENTS

| 5,985,605 | A | 11/1999 | Cheng et al. | |
| 7,414,781 | B2* | 8/2008 | Mann et al. | 359/365 |
| 8,194,230 | B2* | 6/2012 | Chan et al. | 355/57 |
| 8,279,404 | B2* | 10/2012 | Chan et al. | 355/67 |
| 2001/0050740 | A1* | 12/2001 | Goto et al. | 349/124 |
| 2002/0171922 | A1* | 11/2002 | Shiraishi et al. | 359/359 |
| 2003/0099034 | A1* | 5/2003 | Mann et al. | 359/359 |
| 2005/0213198 | A1* | 9/2005 | Lee et al. | 359/359 |
| 2006/0192147 | A1* | 8/2006 | Kandaka et al. | 250/492.1 |
| 2006/0245057 | A1 | 11/2006 | Van Herpen et al. | |
| 2007/0171558 | A1* | 7/2007 | Mann et al. | 359/857 |
| 2008/0165415 | A1* | 7/2008 | Chan et al. | 359/351 |
| 2008/0273185 | A1* | 11/2008 | Omura et al. | 355/67 |
| 2009/0052073 | A1* | 2/2009 | Mann et al. | 359/858 |
| 2009/0097104 | A1* | 4/2009 | Kandaka et al. | 359/359 |

FOREIGN PATENT DOCUMENTS

DE  101 55 711  5/2003

OTHER PUBLICATIONS

German Examination Report with English translation for DE Appl No. 10 2010 062 597.3, dated Jun. 16, 2011.

* cited by examiner

*Primary Examiner* — Deoram Persaud
(74) *Attorney, Agent, or Firm* — Fish & Richardson P.C.

(57) ABSTRACT

An optical imaging system serving for imaging a pattern arranged in an object plane of the imaging system into an image plane of the imaging system with the aid of electromagnetic radiation from a wavelength range around a main wavelength $\lambda_0$ has a multiplicity of mirrors. Each mirror has a mirror surface having a reflective layer arrangement having a sequence of individual layers.

28 Claims, 4 Drawing Sheets

REFLECTIVE OPTICAL IMAGING SYSTEM

CROSS-REFERENCE TO RELATED APPLICATIONS

This application claims benefit under 35 U.S.C. §119(e)(1) to U.S. Provisional Application No. 10 61/420,882, filed Dec. 8, 2010. This application also benefit under 35 U.S.C. §119 to German Application No. 10 2010 062 597.3, filed Dec. 8, 2010. The entire contents of both of these applications are hereby incorporated by reference.

FIELD

The disclosure relates to an optical imaging system for imaging a pattern arranged in an object plane into an image plane with the aid of electromagnetic radiation in the extreme ultraviolet range (EUV). Optical imaging systems of this type can be used, for example, in projection exposure apparatuses for producing semiconductor components and other finely structured devices. As projection lenses, they can serve for projecting patterns of photomasks, reticles or other pattern producing devices, which are hereinafter designated generally as masks or reticles, onto an article coated with a light-sensitive layer with extremely high resolution. There are also other optical imaging systems which operate with radiation from the EUV range, for example microscope objectives for the inspection of wafers or masks.

BACKGROUND

In order to be able to produce ever finer structures, various ways of increasing the resolution capability of the projection lenses are pursued. As is known, the resolution capability can be increased by increasing the image-side numerical aperture (NA) of the projection lens. Another measure is to operate with ever shorter wavelengths of the electromagnetic radiation used.

Improving the resolution by increasing the numerical aperture can have some disadvantages. One disadvantage is that the depth of focus (DOF) that can be obtained generally decreases as the numerical aperture increases. This can be disadvantageous because, for example for reasons of the obtainable flatness of the substrates to be structured and mechanical tolerances, a depth of focus of the order of magnitude of at least one micrometer is typically desirable. Therefore, systems have been developed which operate with moderate numerical apertures and obtain the increase in the resolution capability substantially via the short wavelength of the electromagnetic radiation used from the extreme ultraviolet range (EUV). In the case of EUV lithography with operating wavelengths around 13.5 nm, for example given numerical apertures of NA=0.1, theoretically a resolution of the order of magnitude of 0.1 μm can be achieved with typical depths of focus of the order of magnitude of approximately 1 μm.

As is known, radiation from the extreme ultraviolet range generally can no longer be focused with the aid of refractive optical elements, since the short wavelengths are typically absorbed by known optical materials that are transparent at higher wavelengths. Therefore, for EUV lithography, mirror systems are used in which a plurality of imaging, i.e. concave or convex, mirrors provided with reflective layer arrangements (reflection coatings) are arranged between the object plane and the image plane. The layer arrangements used are typically multilayer coatings, that is to say layer arrangements having a sequence of individual layers.

In the case of mirror systems for microlithography which are designed for radiation from the EUV wavelength range, the mirrors used for the exposure or imaging of a mask into an image plane desirably have a high reflectivity, since firstly the product of the reflectivity values of the individual mirrors determines the total transmission of the projection exposure apparatus and since secondly EUV light sources are usually limited in terms of their light power.

Mirrors for the EUV wavelength range around 13 nm having high reflectivity values are known for example from DE 101 55 711 A1. The mirrors described therein have a layer arrangement applied on a substrate and having a sequence of individual layers, wherein the layer arrangement includes a plurality of layer subsystems each having a periodic sequence of at least two individual layers of different materials that form a period. The number of periods and the thickness of the periods of the individual subsystems decrease from the substrate toward the surface. Such mirrors have a reflectivity of greater than 30% in an angle of incidence interval between 0° and 20°.

In this case, the "angle of incidence" denotes the angle between the direction of incidence of a ray and the normal to the surface of the mirror at the point where the ray impinges on the mirror. Since a respective light beam impinges on a mirror from each object point, superimposition of the light beams occurs at each point of the mirror surface used. In this case, at each point of a mirror surface, rays are incident at different angles of incidence. In this application, the term "angle of incidence interval" denotes the angle interval between the largest and the smallest angle of incidence respectively considered at a point of the mirror. The term "mirror having the largest angle of incidence interval" accordingly denotes that mirror whose mirror surface encompasses the surface point having the largest angle of incidence interval.

In the case of the layers mentioned above, however, the reflectivity in the angle of incidence interval specified is not constant, but rather it varies. A variation of the reflectivity of a mirror over the angles of incidence can be problematic particularly for the use of such a mirror at locations with high angles of incidence and with great variation of the angles of incidence (i.e. large angle of incidence interval) in a projection lens for microlithography, since such a variation can lead for example to an excessively large variation of the pupil apodisation of such a projection objective. In this case, the "pupil apodisation" is a measure of the spatial intensity fluctuation over the exit pupil of a projection lens, that is to say an energetic system characteristic value.

In this respect, it is desirable for mirrors which have a broadband reflection effect in the angle space. This angular broadband nature relates to the ability of a layer arrangement to have high reflectivity which varies only as little as possible for an angle of incidence range that is as large as possible.

Since, furthermore, the radiation sources provided for the EUV range, e.g. plasma sources, are typically not narrowband, but rather emit radiation over a relatively wide wavelength range around a main wavelength, a spectral broadband nature, i.e. a broadband nature of the reflection effect of the layer arrangement in the wavelength space, is desirable.

For the design of the entire optical system it should typically be ensured that both energetic system characteristic values, such as e.g. the pupil apodisation and the total transmission, and the aberrations important for the imaging quality, in particular the chromatic aberrations, remain within the scope of predetermined specifications.

SUMMARY

The disclosure provides an optical imaging system which is suitable for application in EUV microlithography and which has a high imaging quality. In particular, the imaging system is intended to be chromatically corrected well with good energetic system characteristic values.

The disclosure takes into consideration the fact that multi-layer reflective layer arrangements introduce at the reflected radiation in the case of multi-beam interference phase changes which can have a measurably disadvantageous influence on the imaging performance of the imaging system. The phase changes are generally relatively small as long as the mirror layers are operated only at relatively small angles of incidence and/or relatively small angle of incidence intervals. If a layer arrangement has to have a high and as far as possible constant reflectivity in a wide angle of incidence interval, then its complex structure can lead to phase changes which occur as aberrations. The latter can impair the optical imaging. Particularly striking are the variations of the phase changes with wavelength, which are perceived as chromatic aberrations. The disclosure provides a remedy here. It has been recognized that layer arrangements optimized toward a small chromatic variation of the average phase can afford significant improvements with regard to chromatic aberrations, without energetic system values being unacceptably impaired.

The multi-beam interference at multilayers is generally described with the aid of the Fresnel formulae. In the context of this application, the term "phase" (designated by parameter PHI) designates the argument PHI of the complex Fresnel reflection coefficient. The Fresnel reflection coefficients for s-polarization and for p-polarization are generally different. The phase PHIs for s-polarization corresponds e.g. to arg(Rs), i.e. PHIs=arg(Rs). The "phase" clearly describes the phase difference of a reflected wave relative to the incident wave, in each case for s-polarization and for p-polarization. The terms "s-polarization" (and "p-polarization") here denote that radiation component in which the vector of the electric field strength is perpendicular (and parallel, respectively) to the plane of incidence spanned by direction of incidence and direction of reflection of the ray.

Analogously to the customary definition of the average reflectance $<R>=(|Rs|+|Rp|)/2$, for the "average phase" $<PHI>$ the following relationship thus arises: $<PHI>=(\arg(Rs)+\arg(Rp))/2$ or $<PHI>=(PHIs+PHIp)/2$. The "average phase" thus averages over the differently polarized components of a reflected ray.

The PV (peak to valley) value of the average phase is defined as the difference between the maximum and minimum values of the average phase.

In general, the phase is dependent, inter alia, on geometrical conditions, in particular on the angle of incidence AOI, and on the wavelength $\lambda$, i.e. $PHI=f(AOI,\lambda)$. For a specific wavelength and a specific angle of incidence or for a narrow angle of incidence range, phase changes can generally be compensated for, such that they do not have a disadvantageous effect. By contrast, if a relatively broadband radiation is used, for example because narrowband radiation sources are not available, then chromatic variations of the phase changes can occur, that is to say variations of the phases depending on the wavelength. Disadvantageous effects can be particularly severe when mirror layers are used with a relatively large angle of incidence range (angle bandwidth). Upon complying with the conditions in accordance with the claimed disclosure, even under such aggravated conditions, disadvantageous phase variations can be kept so small that the optical imaging system, even when a broadband radiation source is used, affords a high imaging quality in conjunction with only small chromatic aberrations.

In some embodiments, at least the mirror having the largest angle of incidence range (angle of incidence interval), i.e. the mirror whose surface encompasses the surface point having the largest angle of incidence interval, has a phase-optimized layer arrangement. In an imaging system including a plurality of mirrors, large angle of incidence intervals generally do not occur at all of the mirrors. Accordingly, the layer arrangements of the mirrors in a multi-mirror system normally have differing complexity. At least for the mirror having the widest angle of incidence intervals, the layer arrangement desirably is phase-optimized in order to reduce the phase changes and, in particular, the chromatic variations thereof.

It can suffice to provide only the mirror having the largest angle of incidence range with a phase-optimized layer arrangement. As a result, a particularly great reduction of chromatic aberrations can already be achieved with a single phase-optimized layer arrangement. In addition, one further mirror or a plurality of further mirrors can also have a phase-optimized layer arrangement.

In some embodiments, the mirror covered with a phase-optimized layer arrangement has a maximum angle of incidence of at least 22° and the angle of incidence range (at least one surface point) has a bandwidth (angle bandwidth) of at least 10°.

It has proved to be expedient if the phase-optimized layer arrangement is designed such that a variation of the average phase with the angle of incidence has an approximately parabolic profile, wherein the average phase in the angle of incidence range deviates less than 20% from the directrix $<PHI>_{REL}=MPV/(AOImax-AOImin)^k \cdot (AOI-AOImin)^k$, where k lies between 1.1 and 2.2. For k=2, the profile is parabolic. For k=1, the profile is linear. Particularly small aberrations result under these conditions. In the formula for the directrix, the parameter MPV denotes the PV value of the average phase, the PV value being averaged over the wavelengths. AOImin and AOImax denote the smallest and the largest angle of incidence, respectively, of the angle of incidence interval considered. $<PHI>_{REL}$ is the relative average phase $<PHI>_{AOI}-<PHI>_{AOImin}$. For the minimum angle of incidence, it is accordingly the case that $<PHI>_{REL}=0$.

In the design of an optical imaging system, i.e. during the process of the optical design, it is possible to attempt to compensate for the phase changes introduced by the layer arrangements with the aid of the surface parameters for the surface form of the mirrors, by changing the surface form. In general, however, it is advantageous if the initially optimized surface forms do not have to be changed, or are only slightly changed, in order not to make the production and the testing of the mirror surfaces more difficult. The target stipulation derived from this for the design of the layer arrangements is that the phase variations desirably are as small as possible, that is to say desirably have a PV value that is as small as possible.

The manner in which the phase changes with the angle of incidence is also of importance. It would generally be expedient for there to be no change with the angle of incidence, or for the change to have a linear profile. However, such simple profiles generally cannot be achieved. It has been recognized that the parabolic profile (quadratic variation) described here generally describes the most expedient option achievable in practice.

A virtually parabolic form of the profile generally becomes more important, the larger the PV value becomes. In the case of a small PV value, other profiles may also be expedient.

The layer arrangements described in this application have relatively large PV values with PV greater than 100°. Under these conditions, in particular, it has proved to be advantageous if the phases for all wavelengths run within a "band" around the directrix. The width of the band is preferably 26° or less. It is particularly advantageous if the width is less than ±13° or even less than ±6°.

These and further features emerge not only from the claims but also from the description and the drawings, wherein the individual features can in each case be realized by themselves or as a plurality in the form of subcombinations in an embodiment of the disclosure and in other fields and constitute advantageous and inherently protectable embodiments. Exemplary embodiments of the disclosure are illustrated in the drawings and are explained in greater detail below.

DETAILED DESCRIPTION OF PREFERRED EXEMPLARY EMBODIMENTS

Specific aspects of exemplary embodiments of the disclosure will now be explained on the basis of examples of optical imaging systems which can be used in projection exposure apparatuses for microlithography, for example in a projection exposure apparatus for producing finely structured semiconductor components.

Figure 1:
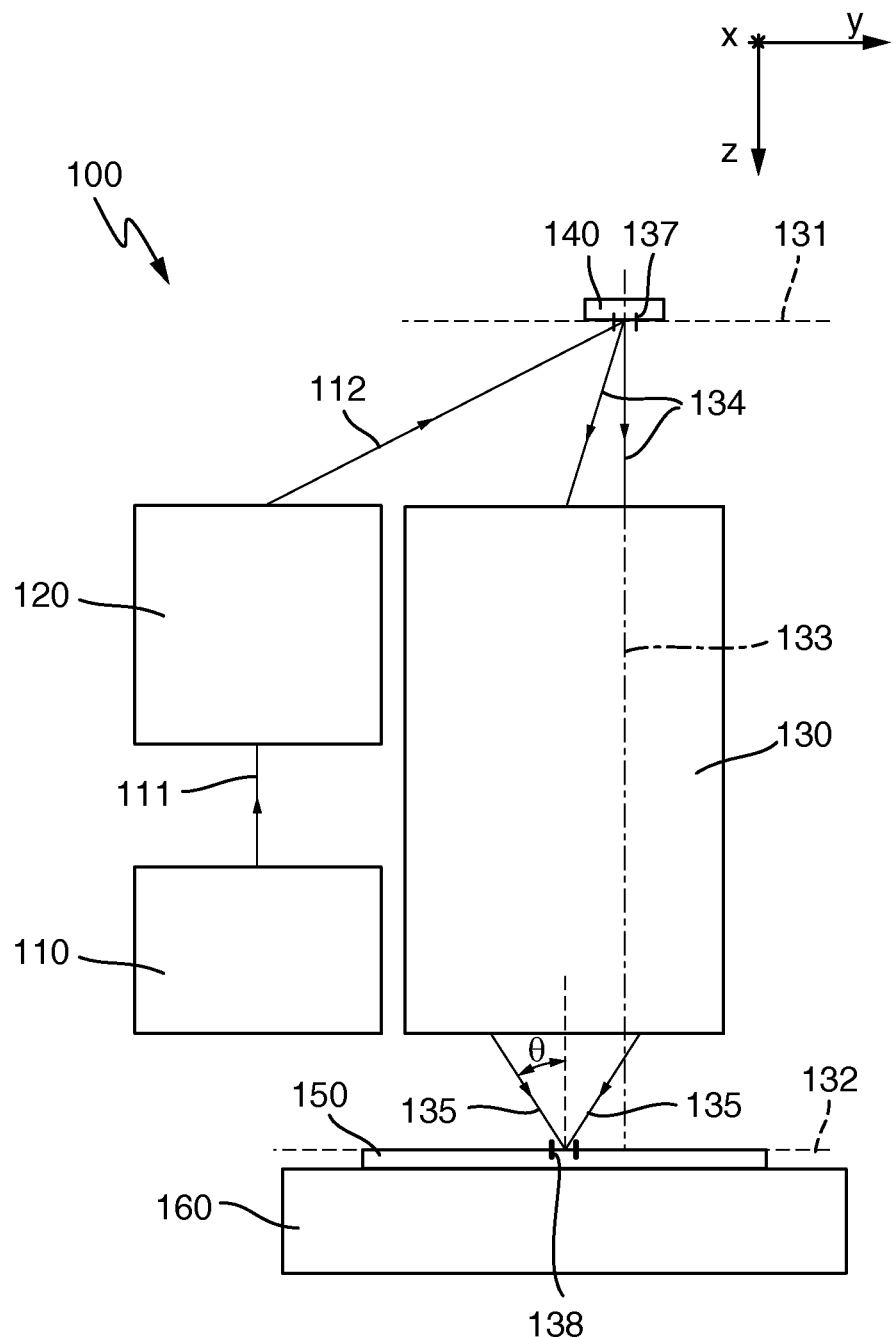
FIG. 1 shows a schematic illustration of a microlithography projection exposure apparatus.

FIG. 1 shows a schematic illustration of a microlithography projection exposure apparatus 100, having a radiation source 110, an illumination system 120 and a projection lens 130. The radiation source 100 generates primary radiation in a wavelength range around a main wavelength $\lambda_o$, wherein this radiation is guided as radiation beams 111 into the illumination system 120. The illumination system 120 changes the primary radiation by expansion, homogenization, changing the ray angle distribution, etc. and thereby generates at its output an illumination radiation beam 112, which impinges on a reflective reticle 140, which bears or produces a pattern to be imaged. The term "reticle" here generally denotes a pattern producing device suitable for producing a pattern.

The projection lens 130 is an optical imaging system designed for imaging the pattern arranged in its object plane 131 into an image plane 132 optically conjugate with respect to the object plane. The radiation passes through the projection lens and impinges in the region of the image plane 132 on the surface of a substrate 150 in the form of a semiconductor wafer carried by a substrate holder 160. The radiation running from the radiation source to the reticle is generally also designated as illumination radiation, while the radiation running from the reticle to the substrate is often designated as imaging radiation or projection radiation.

The projection lens 130 defines a reference axis 133. The object field is centred with respect to the reference axis in the Y-direction. The optical elements of the imaging system can be decentred with respect to the reference axis.

The radiation source 110 is selected in accordance with the desired operating wavelength (working wavelength) of the projection exposure apparatus. In the case of optical systems for microlithography, the working wavelength is typically in the ultraviolet range (UV), in the deep ultraviolet range (DUV) or in the extreme ultraviolet range (EUV) of the electromagnetic spectrum. In the case of the example, the radiation source 110 is an EUV radiation source that generates radiation in a wavelength range of between approximately 5 nm and approximately 30 nm, in particular between approximately 10 nm and approximately 20 nm. The radiation source can be designed, in particular, such that the main wavelength is in the range of approximately 13.5 nm. Other wavelengths from the EUV range (e.g. in the range of approximately 6.9 nm) or radiation sources having higher wavelengths (for example 365 nm, 248 nm, 193 nm, 157 nm, 129 nm or 109 nm) are also possible.

The illumination system 120 includes optical components which are designed and arranged such that illumination radiation having a maximally homogenous intensity profile and defined ray angle distribution is generated. In the case of the example, all the optical components of the illumination system which are provided for beam guiding and/or beam shaping are purely reflective components (mirror components).

The illumination radiation is reflected by the reflective reticle in the direction of the projection lens and modified with regard to angle distribution and/or intensity distribution. That radiation which passes through the projection lens to the substrate forms the imaging beam path, of which schematically two rays 134 are illustrated at the object side of the projection lens (between reticle and projection lens) and two rays 135 converging to an image point are illustrated on the image side (between projection lens and a substrate). The angle formed by the converging rays at the image side of the projection lens is related to the image-side numerical aperture NA of the projection lens. This can be expressed as NA=$n_0$ sin $\theta_{max}$, where $n_0$ is the refractive index of the medium near the substrate surface (for example air, nitrogen, water or some other immersion medium or vacuum), and where $\theta_{max}$ is half the aperture angle of that maximum conical radiation beam which contributes to image generation in the image plane. The image-side numerical aperture can be, for example, 0.1 or more or 0.2 or more or 0.3 or more.

The projection lens is designed to transfer the pattern from the region of the object field 137 of the projection lens on a demagnifying scale into the image field 138 of the projection lens. The projection lens 130 demagnifies by a factor of 4; other demagnification scales, for example 5-fold demagnification, 6-fold demagnification or 8-fold demagnification or else less intense demagnifications, for example 2-fold demagnification, are also possible.

Embodiments of projection lenses for EUV microlithography typically have at least three or at least four mirrors. Exactly six mirrors are often advantageous. Given an even number of mirrors, all the mirrors can be arranged between object plane and image plane and these planes can be oriented parallel to one another, thereby simplifying the integration of the projection lens in a projection exposure apparatus.

In order to facilitate the description of the projection exposure apparatus, a Cartesian x, y, z coordinate system is indicated in FIG. 1. In this case, the z-direction is parallel to the reference axis 133, and the x-y plane is perpendicular thereto, that is to say parallel to the object plane and to the image plane, the y-direction lying in the plane of the drawing in the illustration.

The projection exposure apparatus 100 is of the scanner type. The reticle 140 and the substrate 150 are moved in opposite directions parallel to the y-direction during the operation of the projection exposure apparatus, such that temporally successively different regions of the reticle are transferred to the moving wafer. Embodiments of the stepper type are also possible.

Figure 2:
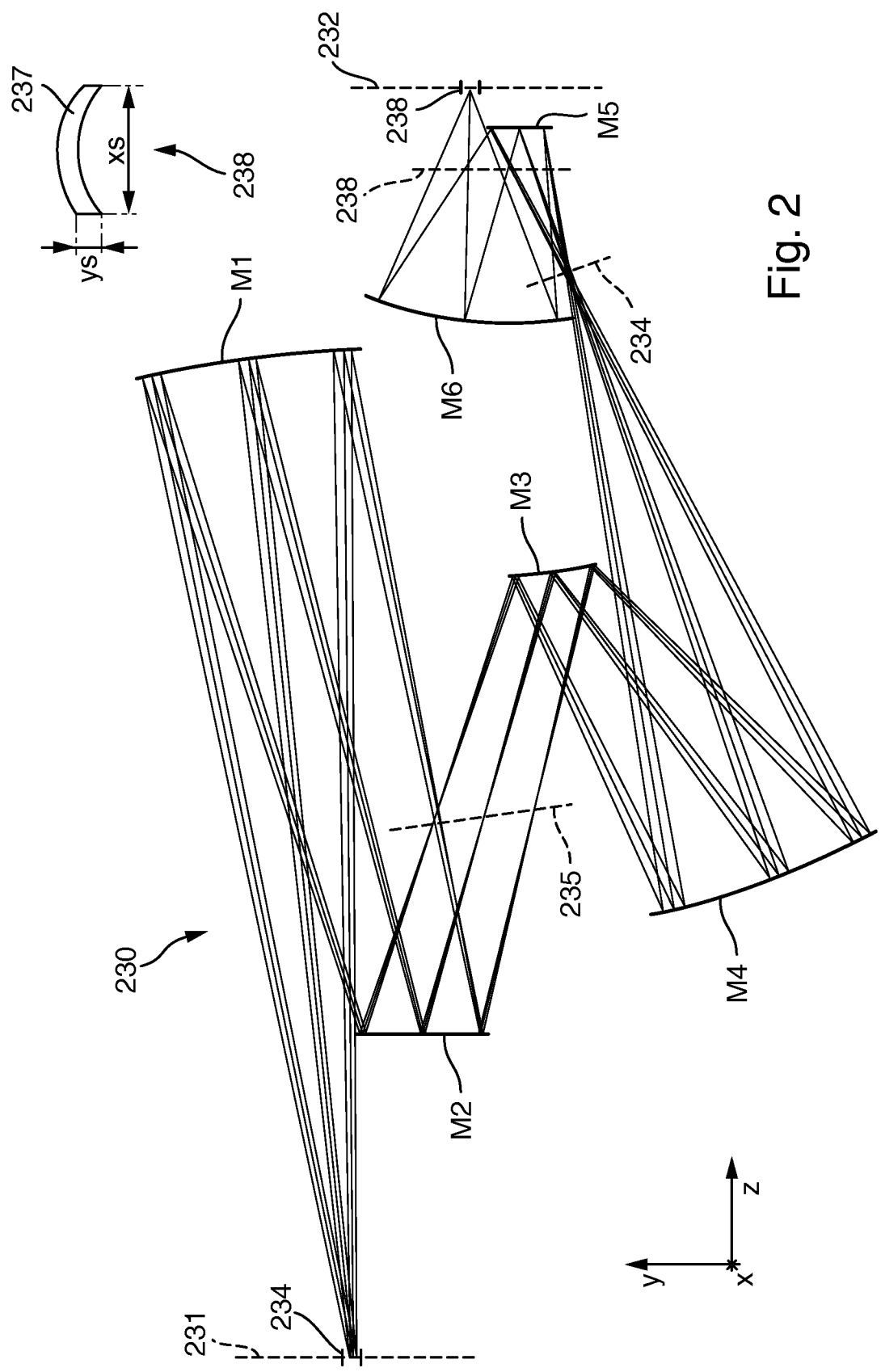
FIG. 2 shows a schematic section through an embodiment of a projection lens for EUV microlithography.

FIG. 2 shows a schematic section through an embodiment of a projection lens 230 with the y-z plane as sectional plane. A total of six mirrors M1 to M6 that are provided with curved mirror surfaces and are thereby imaging are arranged between the object plane 231 and the image plane 232. In each case only the calculated reflection surfaces of the mirrors M1 to M6 are illustrated. The mirrors of the real projection lens are generally larger than the reflection surfaces actually used. The six-mirror system designed for step-and-scan operation operates with an arcuately curved object field (ring field) 237 and attains an image-side numerical aperture NA=0.36. The arcuately curved image field 237 has a field size of 2 mm×26 mm, where the shorter dimension YS=2 mm running parallel to the scan direction is designated as scan slit length, too, and the longer dimension XS measured parallel to the x-axis is also designated as scan slit width. Besides the six mirrors, the projection lens has no optical elements serving for beam guiding and/or beam shaping, that is to say is a catoptric (all reflective) imaging system.

As can be discerned in FIG. 2, the radiation coming from the illumination system from the image-facing side of the object plane firstly impinges on the reflective mask arranged in the object plane. The reflective radiation then impinges on a first mirror M1, which has a concave mirror surface which is directed toward the object and which reflects the impinging radiation onto a second mirror M2 in a slightly constricted fashion. The second mirror M2 has a convex mirror surface which faces the first mirror M1 and which reflects the radiation in the direction of a third mirror M3 as a convergent radiation beam. The third mirror M3 has a convex mirror surface which reflects the radiation in the direction of a fourth mirror M4 having a concave mirror surface. The fourth mirror reflects the impinging radiation to form a real intermediate image 234 onto a fifth mirror M5 arranged in the vicinity of the image plane 232. The fifth mirror has a convex mirror surface which faces away from the image plane and which reflects the impinging divergent radiation in the direction of a sixth mirror M6, which has a concave mirror surface which faces the image plane and by which the impinging radiation is reflected and focused onto the image plane 232.

A pupil plane 235 lying within the projection lens lies optically and geometrically between the second mirror M2 and the third mirror M3. The projection lens has a negative vertex focal length of the entrance pupil since the principal rays of the radiation beams coming from different object points run divergently with respect to one another from the object field 234 into the projection lens. The entrance pupil lies in the imaging beam path upstream of the object field. This makes it possible, for example, to arrange, in the beam path upstream of the projection lens, a pupil component of the illumination system in the entrance pupil of the projection lens, without further imaging optical components having to be present between the pupil component and the object plane 231. The imaging beam path is unfolded. The intermediate image plane 234 lies in the imaging beam path between the fourth and fifth mirrors and, from a geometrical standpoint, between the sixth mirror and the image plane.

All the reflection surfaces of the mirrors M1 to M6 of the projection lens 230 are embodied as static freeform surfaces. In this case, a "freeform surface" is a rotationally asymmetrical (non-rotationaly symmetrical) surface, wherein the surface coordinates of the rotationally asymmetrical surface preferably deviate by at least one wavelength (main wavelength) from a best-matched rotationally symmetrical surface. A static freeform surface is understood to be a freeform surface which is not actively changed in terms of its form during the operation of the imaging system. Of course, a static freeform surface can be displaced overall for adjustment purposes. In the exemplary embodiment, the static freeform surfaces advantageously have a plane of symmetry which coincides with the Y-Z plane. This is advantageous in order not to disturb the symmetry of the imaging.

The optical data of the projection lens according to FIG. 2 are represented below on the basis of a table A subdivided into a plurality of sub-tables TA1, TA2, TA3 and TA4.

The exact form of the individual reflection surfaces of the mirrors M1 to M6 results as the sum of a rotationally symmetrical reference asphere, which is also designated as basic asphere, and a freeform term in the form of an XY polynomial. The value Y is dependent on the position of the respective mirror M1 to M6.

The basic asphere is calculated with the aid of the following asphere equation:

$$z = \frac{h^2/RDY}{1+\sqrt{1-(CCY)h^2/RDY^2}} + \sum_{k=1}^{m} c_k h^l, \quad (1)$$

$$h = \sqrt{x^2+y^2}$$

x and y in this case denote the coordinates on the basic asphere, preceding from a coordinate origin, which can also lie outside the used region of the surface of the basic asphere. The letter z denotes a sagitta of the basic asphere. RDY is the radius of the basic asphere, that is to say the inverse of the surface curvature at the coordinate origin. CCY is a conical parameter. The value "d" denotes the distance from the respective succeeding component.

In the second sub-table TA2, the value "coefficient" denotes the index k for the coefficient $c_k$ of the basic asphere equation (1). The following freeform surface term is added:

$$z_F \sum_{i=0}^{n} \sum_{j=0}^{n} a_{i,j} x^i y^j \quad (2)$$

The parameter $z_F$ denotes the sagitta of the freeform term relative to the reference asphere.

TABLE A

| | | | | | | | | |
|---|---|---|---|---|---|---|---|---|
| TA1: Projection lens 230 | | | | | | | | |
| | Object | M1 | M2 | B1 | M3 | M4 | M5 | M6 |
| d[mm] | 1273 | 647.5168 | 298.7218 | 288.5807 | 471.688 | 1054.9163 | 261.6802 | −314.6097 |
| RDY[mm] | | −1620.947 | 64853.9317 | 0 | 406.1090 | −775.1996 | 423.7303 | −342.0573 |
| CCY | | 0.6937 | 0 | 0 | 0.36987 | −0.0281 | −4.0289 | 0.0386 |

The pupil surface (abbreviated by BL in Table TA3) lies optically between M2 and M2 at a distance d=288.5607 mm behind M2.

| TA2: Basic aspheres | | | | | | |
|---|---|---|---|---|---|---|
| coefficients | M1 | M2 | M3 | M4 | M5 | M6 |
| 1 | 0.000000E+00 | 0.000000E+00 | 0.000000E+00 | 0.000000E+00 | 0.000000E+00 | 0.000000E+00 |
| 2 | 0.000000E+00 | 0.000000E+00 | 0.000000E+00 | 0.000000E+00 | 0.000000E+00 | 0.000000E+00 |
| 3 | 0.000000E+00 | 0.000000E+00 | 0.000000E+00 | 0.000000E+00 | 0.000000E+00 | 0.000000E+00 |
| 4 | 8.647702E−12 | 6.951527E−10 | −4.656855E−09 | 6.795484E−13 | 1.343769E−08 | −6.169625E−11 |
| 5 | 0.000000E+00 | 0.000000E+00 | 0.000000E+00 | 0.000000E+00 | 0.000000E+00 | 0.000000E+00 |
| 6 | 1.071677E−17 | −6.044776E−15 | 5.303950E−15 | 1.813357E−17 | 2.085194E−12 | −1.479363E−15 |
| 7 | 0.000000E+00 | 0.000000E+00 | 0.000000E+00 | 0.000000E+00 | 0.000000E+00 | 0.000000E+00 |
| 8 | 1.730662E−23 | 1.716318E−19 | −9.132512E+19 | −1.641079E−22 | −4.331471E−18 | −7.668868E−21 |
| 9 | 0.000000E+00 | 0.000000E+00 | 0.000000E+00 | 0.000000E+00 | 0.000000E+00 | 0.000000E+00 |
| 10 | −1.055102E−27 | −1.055727E−25 | 2.135831E−23 | 1.047603E−27 | 3.164933E−20 | −1.497743E−25 |
| 11 | 0.000000E+00 | 0.000000E+00 | 0.000000E+00 | 0.000000E+00 | 0.000000E+00 | 0.000000E+00 |
| 12 | 6.578304E−33 | −2.011500E−28 | −5.507934E−20 | −4.331076E−33 | 1.820370E−23 | 2.668526E−30 |
| 13 | 0.000000E+00 | 0.000000E+00 | 0.000000E+00 | 0.000000E+00 | 0.000000E+00 | 0.000000E+00 |
| 14 | −3.123687E−38 | 7.688670E−33 | −1.719130E−32 | 1.023047E−38 | −5.183635E−27 | 3.393835E−35 |
| 15 | 0.000000E+00 | 0.000000E+00 | 0.000000E+00 | 0.000000E+00 | 0.000000E+00 | 0.000000E+00 |
| 16 | 4.653209E−44 | −1.231013E−37 | 5.337622E−37 | −1.035573E−44 | 6.018065E−31 | −2.170944E−39 |

| TA3: Decentrings of the individual elements relative to reference axis 133 [mm] | | | | | | |
|---|---|---|---|---|---|---|
| M1 | M2 | B1 | M3 | M4 | M5 | M6 |
| −2.5911 | 1.2743 | −0.3907 | −1.0799 | 0.7378 | −0.7068 | −0.5374 |

| TA4: Polynomial coefficients | | | | | | | |
|---|---|---|---|---|---|---|---|
| coefficients $8_s$ | | | | | | | |
| xi | yi | M1 | M2 | M3 | M4 | M5 | M6 |
| 0 | 1 | 1.846180E−05 | −1.170113E−05 | 2.395465E−05 | −1.449353E−05 | 2.767933E−06 | 7.522627E−06 |
| 2 | 0 | 6.521110E−08 | 2.202289E−07 | 2.968770E−08 | −6.391010E−08 | −7.052459E−07 | −4.404642E−08 |
| 0 | 2 | −3.189278E−07 | 3.239394E−07 | 1.455885E−06 | 4.102634E−08 | −2.273673E−07 | 5.638062E−08 |
| 2 | 1 | −7.818785E−10 | 6.147575E−10 | 1.378945E−09 | −5.767425E−10 | 3.719132E−09 | −6.005293E−10 |
| 0 | 3 | 1.679699E−09 | 4.294942E−10 | 1.858055E−08 | 6.573175E−10 | −7.510081E−09 | −1.036556E−09 |
| 4 | 0 | −1.205562E−12 | −4.358705E−11 | 1.555655E−10 | 3.697494E−13 | 1.651000E−09 | −1.156117E−12 |
| 2 | 2 | 1.912261E−13 | −1.407041E−10 | 1.613251E−10 | −1.199388E−10 | 2.654968E−09 | −7.236875E−12 |
| 0 | 4 | −3.224167E−12 | −4.801122E−11 | −9.431226E−11 | 2.122243E−12 | 7.909376E−10 | −7.534426E−12 |
| 4 | 1 | 2.926982E−14 | −2.514504E−13 | 1.198505E−12 | 5.399706E−17 | 2.210975E−12 | −3.195870E−15 |
| 2 | 3 | 9.069559E−14 | 1.406102E−12 | −1.809228E−12 | −1.801095E−15 | 1.385658E−11 | 7.492034E−15 |
| 0 | 5 | 2.986112E−15 | 3.141283E−14 | −2.090611E−12 | 1.512350E−17 | 8.954801E−12 | 2.279104E−14 |
| 6 | 0 | −1.731758E−17 | 3.769174E−15 | −1.416804E−14 | −1.351758E−17 | −1.231620E−12 | 3.301893E−16 |
| 4 | 2 | −2.500090E−16 | 1.775556E−14 | −2.558106E−14 | −3.647603E−17 | −3.693502E−12 | 8.376996E−16 |
| 2 | 4 | −6.704530E−18 | 2.145032E−15 | −3.687564E−14 | −2.283703E−18 | −2.646806E−12 | 1.000546E−15 |
| 0 | 5 | −5.268032E−18 | 7.562748E−15 | −6.440863E−15 | −9.759427E−19 | −1.083127E−12 | 3.855700E−16 |
| 8 | 1 | −1.004927E−21 | −1.572290E−17 | −2.386210E−16 | −5.320713E−20 | −5.252442E−15 | 3.736716E−19 |
| 4 | 3 | 6.387656E−19 | −4.005404E−18 | −2.701709E−16 | −1.526499E−19 | −2.296444E−14 | 4.099755E−19 |
| 2 | 5 | 1.857959E−18 | −1.003639E−18 | −1.395281E−16 | 3.075019E−20 | −1.252298E−14 | −3.686084E−19 |
| 0 | 7 | −4.120705E−20 | −6.510743E−17 | 1.974350E−16 | −3.494383E−21 | −1.384783E−14 | −3.097600E−10 |
| 8 | 0 | 8.162646E−23 | −8.684744E−20 | 4.813116E−19 | 1.019779E−22 | 4.025254E−18 | −2.937224E−21 |
| 5 | 2 | 7.465766E−22 | −4.013641E−19 | −4.027420E−18 | 8.763033E−23 | 1.721149E−15 | −8.610872E−21 |
| 4 | 4 | 7.863046E−23 | −1.558272E−19 | −1.259064E−18 | −2.228063E−22 | 2.478339E−15 | −8.390856E−21 |
| 2 | 5 | −1.957257E−21 | 5.742586E−19 | −5.498880E−19 | 5.062466E−20 | 1.489116E−15 | −5.496438E−21 |
| 0 | 8 | 2.218297E−22 | 1.581607E−19 | 9.219411E−19 | 1.092395E−23 | 2.298621E−16 | 3.876936E−22 |
| 8 | 1 | −3.980977E−25 | 7.071499E−22 | −1.145224E−20 | 6.370351E−25 | 1.353570E−18 | 2.648538E−24 |
| 6 | 3 | −1.974920E−24 | 1.633093E−21 | −6.274025E−20 | 4.928618E−25 | 4.937785E−18 | 3.192921E−23 |
| 4 | 5 | −1.641094E−24 | −1.028125E−21 | −2.778074E−20 | −1.029696E−25 | 6.671353E−18 | 1.031813E−22 |
| 2 | 7 | 2.270082E−25 | −2.922938E−21 | −1.536249E−20 | −1.107175E−25 | 3.649074E−18 | 9.197748E−23 |
| 0 | 9 | −2.566508E−25 | −2.287026E−22 | −8.673204E−22 | −6.509768E−27 | −1.285779E−19 | 3.434410E−24 |
| 10 | 0 | 2.492528E−28 | −7.161278E−25 | −2.890838E−23 | 6.372074E−20 | −6.167818E−20 | −1.107621E−25 |
| 8 | 2 | −2.169589E−28 | 4.163075E−24 | −1.414277E−22 | 9.038151E−28 | −2.764010E−19 | −6.905022E−25 |
| 6 | 4 | 7.076098E−28 | 1.496024E−23 | −3.163914E−22 | 4.492999E−28 | −6.862583E−19 | −1.607239E−24 |
| 4 | 6 | 6.389191E−28 | 2.116809E−23 | −1.690865E−22 | 6.670942E−29 | −5.530890E−19 | −2.015319E−24 |

TA4: Polynomial coefficients

| coefficients 8, | | | | | | | |
|---|---|---|---|---|---|---|---|
| xi | yi | M1 | M2 | M3 | M4 | M5 | M6 |
| 2 | 8 | 2.961008E−28 | 1.211030E−23 | −7.269945E−23 | −1.611393E−28 | −2.612100E−19 | −1.180674E−24 |
| 0 | 10 | −3.915221E−30 | 1.593914E−24 | −1.184955E−23 | −7.635349E−30 | −5.694970E−20 | −1.817052E−25 |

Each of the mirrors M1 to M6 has a substrate covered with a layer arrangement which is reflective in the EUV range and which forms the mirror surface.

The construction of the layer arrangements can be optimized with regard to different optimization targets. In general, it is important, inter alfa, to assess an optical imaging system with regard to energetic system variables including, in particular, transmission and apodisation.

For the best possible apodisation of the optical system in which a reflective layer arrangement is used, e.g. the reflection of the coating desirably is as uniform as possible for the angle of incidence ranges that occur on the coated surface.

In the context of this application, the so-called APO value is used as a measure of the variation of the reflectivity of a mirror over the angle of incidence. In this case, the APO value is defined as the difference between the maximum reflectivity Ru_max and the minimum reflectivity Ru_min in the angle of incidence interval considered, divided by the mean reflectivity Ru_mean in the angle of incidence interval considered. Consequently, the following holds true:

$$APO = (Ru\_max - Ru\_min)/Ru\_mean.$$

In this case, the parameter Ru denotes the average reflection $Ru = (Rs + Rp)/2$ in the relevant angle of incidence interval.

The fifth mirror M5 is that mirror whose mirror surface is exposed to the largest angle of incidence interval of the radiation. That is to say that that surface point having the largest angle of incidence interval lies at the mirror surface of the fifth mirror. The angle of incidence range (the angle of incidence interval) extends e.g. from AOI≈14° to AOI≈26°. Moreover, the fifth mirror M5 is that mirror at which the largest angles of incidence (absolute values) occur.

For this reason, the effect of a phase-optimized layer (or of a phase-optimized layer arrangement) is illustrated here by way of example for the fifth mirror M5. The angle of incidence ranges (angle of incidence intervals) on the other mirrors are significantly smaller, namely approximately 0.78° for the first mirror M1, 1.89° for the second mirror M2, 2.12° for the third mirror M3, 0.54° for the fourth mirror M4 and 1.51° for the sixth mirror M6. The influence of these mirrors on the phases is accordingly significantly less critical.

In order to better illustrate properties and effects of the phase-optimized layer arrangement on the fifth mirror M5, the layer arrangements on the other mirrors M1, M2, M3, M4 and M6 are set as ideally reflective. In this context, ideally reflective means that the reflectance of the mirrors is 100% and does not depend on the angle of incidence.

For a reference system, different layer arrangements were produced for the fifth mirror M5 with regard to the optimization target of the smallest possible apodisation in conjunction with acceptable other energetic variables. One of these layer arrangements, designated by "REF" hereinafter, is specified in greater detail below.

It is desirable to take into account here that the EUV radiation source effects relatively broadband emission, such that the primary radiation originates from a wavelength range between a lower secondary wavelength $\lambda_{min} < \lambda_0$ and an upper secondary wavelength $\lambda_{max} > \lambda_0$ and has a measured wavelength bandwidth $\Delta\lambda = \lambda_{max} - \lambda_{min}$ of at least 0.25 nm.

Considerable improvements in the chromatic aberrations arose by taking account of phase changes. The imaging performance of the projection lens can be significantly improved overall if at least one of the mirrors, in particular the mirror having the largest angle of incidence range and/or a mirror having an angle of incidence range of more than 8° has a phase-optimized layer arrangement in which the relative average phase for each wavelength within the wavelength bandwidth deviates by a maximum of 25° from the relative average phase at the main wavelength.

This is explained in detail by way of example below.

In preferred embodiments, a layer arrangement has a plurality of periodic partial coating(s) or layer subsystems. In this case, the layer subsystems each consist of a periodic sequence of at least two periods of individual layers. In this case, the periods include two individual layers composed of different materials for a high refractive index layer and a low refractive index layer and have within each layer subsystem a constant thickness that deviates from a thickness of the periods of an adjacent layer subsystem.

The layer subsystems of the layer arrangement can directly succeed one another; in that case, they are not separated by a further layer system. It has proved to be expedient to differentiate a layer subsystem from an adjacent layer subsystem, even with otherwise identical division of the periods between high and low refractive index layers, when a deviation in the thickness of the periods of the adjacent layer subsystems of more than 0.1 nm is present, since, above a difference of 0.1 nm, it is possible to assume a different optical effect of the layer subsystems with otherwise identical division of the periods between high and low refractive index layers.

The terms "high refractive index" and "low refractive index" are relative terms with regard to the respective partner layer in a period of a layer subsystem. Layer subsystems function in the EUV wavelength range generally only if a layer that acts with an optically high refractive index is combined with an optically lower refractive index layer relative thereto as main constituent of a period of the layer subsystem.

In some embodiments, the two individual layers forming a period consist either of the materials molybdenum (Mo) and silicon (Si) or of the materials ruthenium (Ru) and silicon (Si). It is thereby possible to obtain particularly high reflectivity values and at the same time to realize advantages in terms of production engineering, since only two different materials are used for producing the layer subsystems of the layer arrangement of the mirror.

A period can contain additional layers or layer systems which act as a diffusion and reaction barrier for the two layer materials of a period (so-called "barrier layer"). In some embodiments, these individual layers are separated by at least one barrier layer consisting of a material which is selected or composed as compound from the group of materials: B4C, C, Si nitride, Si carbide, Si boride, Mo nitride, Mo carbide, Mo boride, Ru nitride, Ru carbide and Ru boride. Such a barrier layer suppresses the interdiffusion between the two individual layers of a period, thereby increasing the optical contrast during the transition between the two individual layers. When the materials molybdenum and silicon are used for the two individual layers of a period, one barrier layer above the Si layer as seen from the substrate suffices in order to provide for sufficient contrast. The second barrier layer above the Mo layer can be dispensed with in this case.

In addition, a cap layer system can be applied, which terminates the layer arrangement of the mirror and acts as oxidation protection, inter alia, for example if the coated mirror is exposed to the atmosphere. A cap layer system including at least one layer composed of a chemically inert material can also facilitate the elimination of contaminations.

Furthermore, it is possible to provide an intermediate layer or an intermediate layer arrangement between the layer arrangement of the mirror and the substrate, which serves for the stress compensation of the layer arrangement. By virtue of such stress compensation it is possible to avoid deformation of the mirror when the layers are applied.

For the calculation of the reflectivity values or the reflectances of layer arrangements, the complex refractive indexes $n^* = n - i \cdot k$ indicated in Table B were used for the used materials at the wavelength of 13.5 nm. In this case, it is desirable to take into account that reflectivity values of real mirrors may turn out to be lower than the calculated theoretical reflectivity values, since, in particular, the refractive indexes of real thin layers can deviate from the literature values mentioned in Table B.

TABLE B

| Material | Symbol chemical | Symbol layer design | Note | n | k |
|---|---|---|---|---|---|
| Mirror | | | | 0.973713 | 0.0129764 |
| Silicon | Si | S | Layer high refractive index | 0.999362 | 0.00171609 |
| Boron carbide | B4C | B | Barrier layer | 0.963773 | 0.0051462 |
| Molybdenum | Mo | M | Layer low refractive index | 0.921252 | 0.0064143 |
| Ruthenium | Ru | R | Cap layer and layer low refractive index | 0.889034 | 0.0171107 |
| Vacuum | | | | 1 | 0 |

In the illustration of the construction of a layer arrangement, the symbols from Table B are used for the materials of the individual layers. Before the symbols, i.e. to the left of the symbols, there are the associated geometrical layer thicknesses in (nm), unless indicated otherwise. If a coating contains periodic partial coatings (periodic layer subsystems), then the period is placed between parentheses and the number of periods is after the right-hand parenthesis, i.e. to the right of the right-hand parenthesis. The notation is always such that the substrate (SUB) is on the left and the medium of incidence (vacuum in the case of EUV) is on the right. Specified layer designs do not contain a possibly envisaged individual anti-stress coating applied very close to the substrate, i.e. directly to the substrate. A short notation for a periodic layer arrangement as used in this application then appears as follows:

SUB/(period 1)$p1$(period 2)$p2$(period 3)$p3$ cap layer/vacuum

In this case, the parameter pi denotes the number of periods of the i-th periodic partial coating or of the i-th periodic layer subsystem. If only one layer subsystem is present, i.e. in the case of p2, p3=0, reference is generally made to a "monostack". Accordingly, a "bi-stack" is present in the case of p1, p2≠0 and p3=0 and a "tri-stack" is present in the case of p1, p2, p3≠0.

Layer arrangements of the tri-stack type have proved to be particularly advantageous.

Table C below compares the layer construction of the layer arrangement REF used for comparison purposes and optimized with regard to apodisation, and of a phase-optimized layer arrangement PO in accordance with one exemplary embodiment. Both layer arrangements are designed for an angle of incidence range (AOI range) of 14.06° to 25.67°.

TABLE C

| Optimization target | Name layer design | Layer design (substrate is on the left) |
|---|---|---|
| Energetic variables | REF | (1.670S.4B4.765M.4B)28 (3.221S.4B4.578M.4B)5 (3.567S.4B3.167M.4B)152.548S.4B2.0M1.5R |
| Energetic variables and average phase | PO (exemplary embodiment) | 2.581S.4B3.382M.4B)28(2.511S.4B5.436M.4B)5 3.586S.4B3.143M.4B)152.562S.4B2.0M1.5R |

Some relevant optical properties of the layer arrangements will now be explained in connection with FIGS. 3 to 5.

Figure 3:
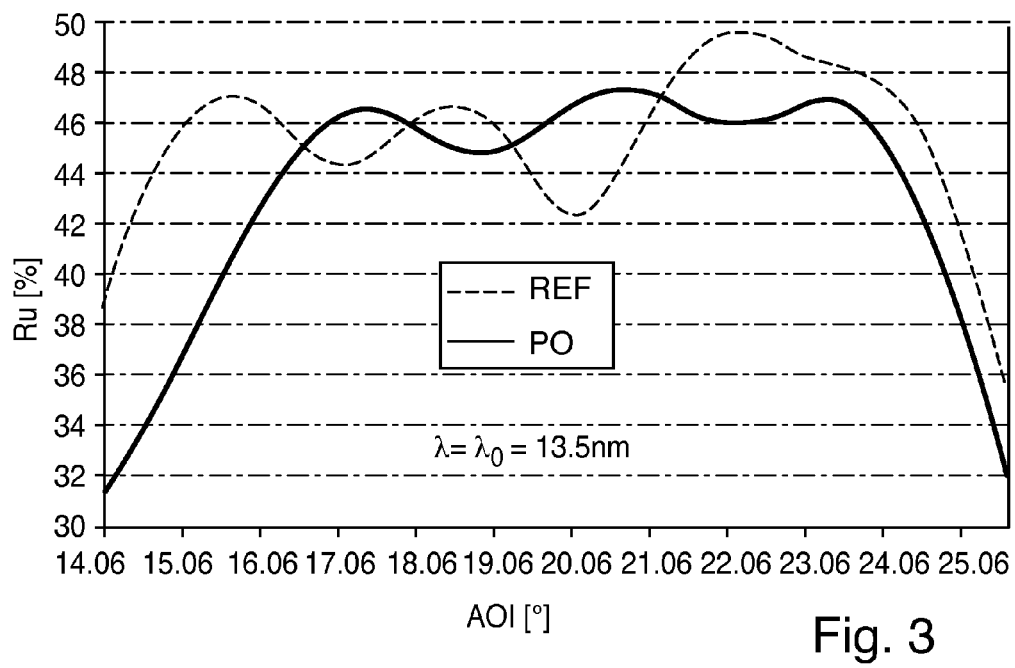
FIG. 3 shows the functional dependence of the unpolarized reflection RU (in %) at the main wavelength $\lambda_0=13.5$ nm for the reference layer arrangement REF and for the phase-optimized layer arrangement PO of the exemplary embodiment in the angle of incidence interval of the fifth mirror M5.

FIG. 3 shows in a joint illustration the functional dependence of the average reflection Ru (in %) at the mean wavelength $\lambda_0 = 13.5$ nm for the reference layer arrangement REF and for the phase-optimized layer arrangement PO of the exemplary embodiment, in each case for the angles of incidence occurring at the fifth mirror M5 (angle of incidence interval of 14.6° to 25.67°). In this case, the parameter Ru denotes the average reflection Ru=(Rs+Rp)/2 in the relevant angle of incidence interval. The relatively constant reflectivity of the phase-optimized layer arrangement in the angle of incidence interval indicated is more clearly discernible. In accordance with the relationship $APO = (Ru\_\max - Ru\_\min)/Ru\_\mathrm{mean}$.

an APO value APO=33% results for the reference system REF and APO=37% results for the phase-optimized layer arrangement PO of the exemplary embodiment.

Since, for the optical effect of the layer arrangement, in the present case, rather than the absolute values of the average values, only the change thereof in the angle of incidence interval affected is relevant, the relative average phase $<PHI>_{REL}$ is intended to be examined further, which, in accordance with $<PHI>_{REL} = <PHI>_{AOI} - <PHI>_{AOImin}$, corresponds to the difference between the average phase $<PHI>_{AOI}$ at the angle of incidence AOI and the average phase $<PHI>_{AOImin}$ at the smallest angle of incidence $AOI_{min}$.

Figure 4:
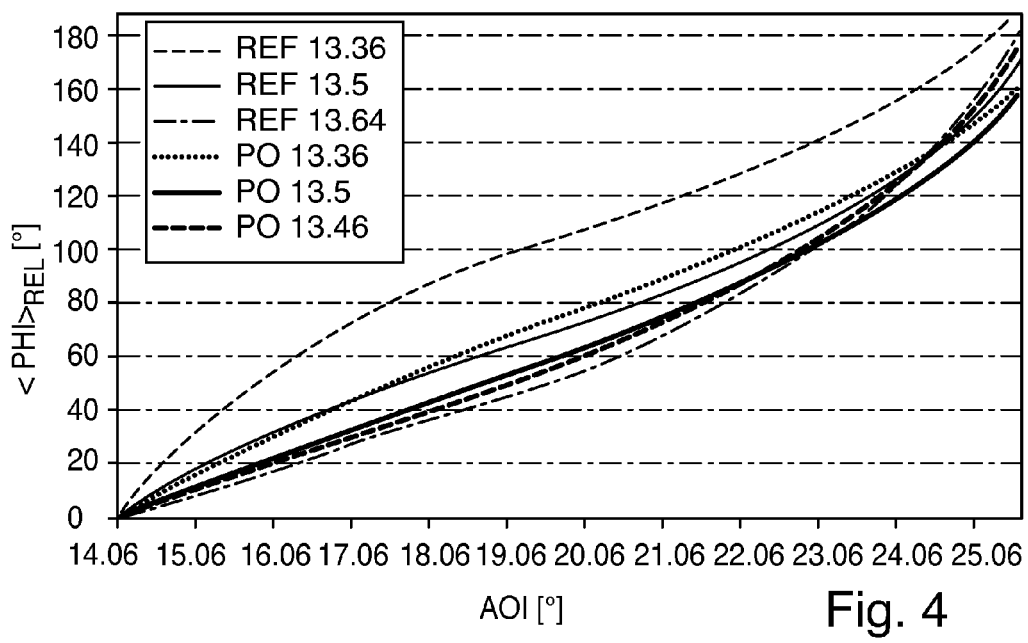
FIG. 4 shows, for three wavelengths ($\lambda_{min}=13.36$ nm, $\lambda_0=13.5$ nm and $\lambda max=13.64$ nm), the dependence of the relative average phase $<PHI>_{REL}$ on the angle of incidence AOI for the relevant angle of incidence range of the fifth mirror M5.

FIG. 4 illustrates for three wavelengths ($\lambda_{min} = 13.36$ nm, $\lambda_0 = 13.5$ nm and $\lambda\max = 13.64$ nm) of the EUV wavelength range considered the dependence of the relative average phase <PHI>$_{REL}$[°] on the angle of incidence AOI[°] for the relevant angle of incidence range of between approximately 14 nm and approximately 26 nm. Here, too, the corresponding values of the reference layer arrangement REF and of the exemplary embodiment of the phase-optimized layer arrangement PO are compared with one another in joint illustration. It can be discerned that in any case the average phase increases continuously from the smaller to the larger angle of incidence. For the phase-optimized layer arrangement PO, however, the angular profiles are significantly closer together than in the case of the reference layer arrangement REF. This clearly shows the smaller chromatic variation of the average phase relative to the reference system. What is striking, in particular, is that, in the exemplary embodiment PO, the profile for the lower secondary wavelength $\lambda_{max}$=13.36 nm is significantly closer to the profiles applicable to higher wavelengths than in the case of the reference layer arrangement. Moreover, the profiles have no local extreme points, but rather increase continuously.

Figure 5:
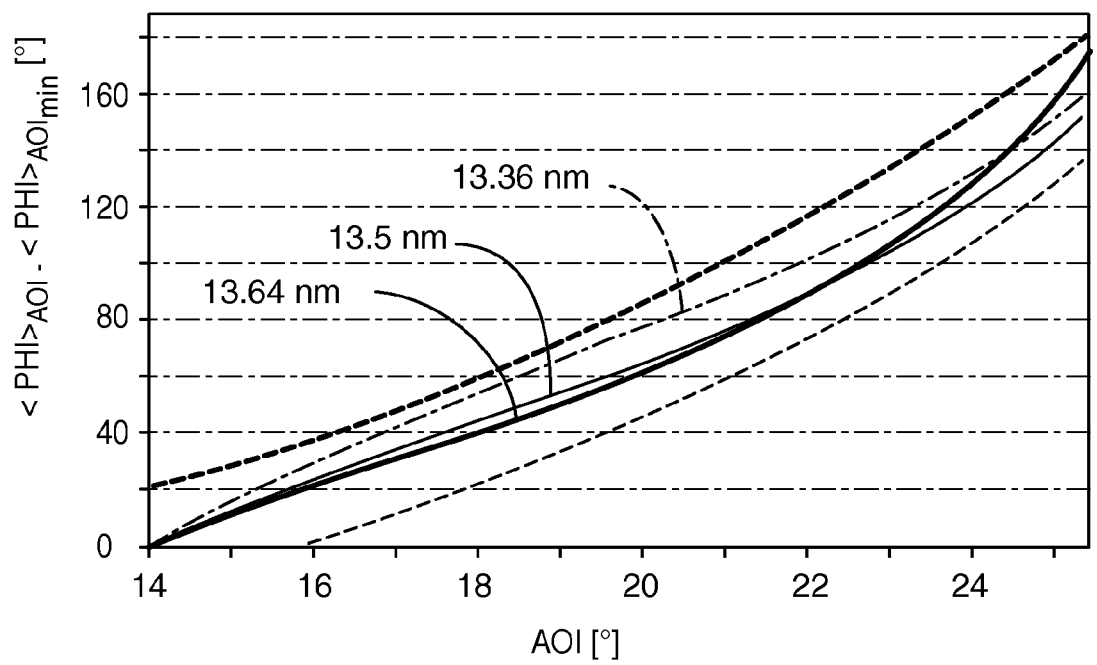
FIG. 5 shows the variation of the relative average phase $<PHI>_{REL}=<PHI>_{AOI}-<PHI>_{AOImin}$ with the angle of incidence AOI for three wavelengths $\lambda_{min}=13.36$ nm, $\lambda_0=13.5$ nm and $\lambda_{max}=13.64$ nm.

The variation of the relative average phase <PHI>$_{REL}$ with the angle of incidence AOI at the three wavelengths 13.36 nm, 13.5 nm and 13.64 nm used for the calculation, corresponding to a wavelength bandwidth $\Delta\lambda$=0.28 nm around the main wavelength $\lambda_0$=13.5 nm, is clearly illustrated on the basis of the diagram in FIG. 5.

It can be discerned that, at all three wavelengths, the average phase has a profile increasing continuously without extreme points. At all three wavelengths, an approximately parabolic profile of the average phase arises. In particular, it can be discerned that the average phase in the angle of incidence range deviates by less than 20% from a virtually parabolic directrix <PHI>$_{REL}$=MPV/(AOImax−AOImin)$^k$×(AOI−AOImin)$^k$, where k lies between 1.1 and 2.2. For k=2, the profile is parabolic, and for k=1, the profile is linear. MPV is the PV value of the relative average phase, the PV value being averaged over the wavelengths. AOImin and AOImax are the smallest and the largest angle of incidence, respectively, in the angle of incidence interval. <PHI>$_{REL}$ is the relative average phase <PHI>(AOI)−<PHI>(AOImin). For the minimum angle of incidence, accordingly <PHI>$_{REL}$=0.

It can be discerned from FIG. 5 that the profiles for the relative average phases at all the wavelengths considered in the wavelength band run in a range defined by two directrices displaced from one another, the width of the range (in the direction of the y-axis) being less than ±26°. The chromatic aberrations are particularly small when the profiles lie in a band whose width is smaller than ±13° or even smaller than ±6°.

The use of a phase-optimized layer arrangement at the fifth mirror, i.e. at the mirror having the largest angle of incidence interval, affords a considerable improvement in the chromatic aberrations of the overall system, while at the same time energetic system values can be kept within acceptable limits.

Table D below illustrates the calculated values of the aberrations of the projection lens in the comparison of the reference system (REF) with the exemplary embodiment (PO). Table D shows the maximum wavefront aberrations in [m$\lambda$] for the three wavelengths $\lambda$=13.36 nm, $\lambda$=13.5 nm and $\lambda$=13.64 nm of the wavelength band considered firstly for the reference system REF and secondly for the phase-optimized layer arrangement PO. The improvement in the aberration, particularly for the two limit wavelengths $\lambda$min=13.36 nm and $\lambda$max=13.64 nm, is significant. An improvement by somewhat more than 10% results for the main wavelength $\lambda_0$=13.5 nm, too.

TABLE D

| | REF | Projection lens |
|---|---|---|
| | Aberration | |
| For $\lambda$ = 13.36 nm: | 35.7 | 15.2 |
| For $\lambda$ = 13.5 nm: | 10.7 | 9 |
| For $\lambda$ = 13.64 nm: | 19.07 | 14.2 |

With the reduction of the wavefront aberrations both for the main wavelength and for the secondary wavelengths, the contrast in the image is significantly improved. Moreover, radiation sources having a wider wavelength range can be used. The light intensity and the throughput are increased as a result.

What is claimed is:

1. An optical imaging system configured to image a pattern arranged in an object plane of the imaging system into an image plane of the imaging system via electromagnetic radiation having a wavelength range around a main wavelength $\lambda_0$, the optical system comprising:
   a plurality of mirrors,
   wherein:
      each mirror has a mirror surface comprising a reflective layer arrangement having a sequence of individual layers;
      each mirror surface is arranged in a beam path between the object plane and the image plane so that, during use of the optical imaging system, each reflective layer arrangement is irradiated from an angle of incidence range characteristic of the mirror and to generate an average phase <PHI>(AOI)=(PHI$_p$+PHI$_s$)/2 for each ray impinging at an angle of incidence AOI, where PHI$_p$ is a phase for a p polarized radiation component and PHI$_s$ is a phase for an s polarized radiation component;
      the wavelength range has a wavelength bandwidth $\Delta\lambda$ of at least 0.25 nm measured between a lower secondary wavelength $\lambda_{min}<\lambda_0$ and an upper secondary wavelength $\lambda_{max}<\lambda_0$; and
      at least one mirror has an angle of incidence interval of more than 8° and also has a phase optimized layer arrangement in which, for each angle of incidence of the angle of incidence interval, a relative average phase for each wavelength within the wavelength bandwidth deviates by a maximum of 25° from a relative average phase at the main wavelength.

2. The optical imaging system of claim 1, wherein a mirror having a largest angle of incidence range has a phase optimized layer arrangement in which, for each angle of incidence of the angle of incidence interval, a relative average phase for each wavelength within the wavelength bandwidth deviates by a maximum of 25° from a relative average phase at the main wavelength.

3. The optical imaging system of claim 1, wherein only a mirror having a largest angle of incidence range has a phase optimized layer arrangement in which, for each angle of incidence of the angle of incidence interval, a relative average phase for each wavelength within the wavelength bandwidth deviates by a maximum of 25° from a relative average phase at the main wavelength.

4. The optical imaging system of claim 1, wherein a mirror having a maximum angle of incidence of at least 22° and at which the angle of incidence range has a bandwidth of at least 10° has a phase optimized layer arrangement in which, for each angle of incidence of the angle of incidence interval, a relative average phase for each wavelength within the wavelength bandwidth deviates by a maximum of 25° from a relative average phase at the main wavelength.

5. The optical imaging system of claim 1, wherein:
the phase optimized layer arrangement has a plurality of periodic layer subsystems;
the layer subsystems each consist of a periodic sequence of at least two periods of individual layers;
the periods have two individual layers composed of different materials for a high refractive index layer and a low refractive index layer, which have within each layer subsystem a constant thickness which deviates from a thickness of the periods of an adjacent layer subsystem; and
the layer arrangement preferably has three different periodic layer subsystems.

6. The optical imaging system of claim 5, wherein the two individual layers forming a period consist either of molybdenum and silicon or ruthenium and silicon.

7. The optical imaging system of claim 6, wherein the individual layers are separated by at least one barrier layer consisting of a material comprising at least one material selected form the group consisting of $B_4C$, C, Si nitride, Si carbide, Si boride, Mo nitride, Mo carbide, Mo boride, Ru nitride, Ru carbide and Ru boride.

8. The optical imaging system of claim 1, wherein the optical imaging system is designed for EUV radiation from a wavelength range of between approximately 5 nm and approximately 30 nm.

9. The optical imaging system of claim 1, wherein the imaging system comprises an even number of mirrors.

10. The optical imaging system of claim 1, wherein the optical imaging system comprises exactly six mirrors.

11. The optical imaging system of claim 1, wherein the mirror surfaces of the mirrors of the imaging system are static freeform surfaces, and a freeform surface is a rotationally asymmetrical surface whose surface coordinates preferably deviate by at least one wavelength from a best matched rotationally symmetrical surface.

12. A projection objective comprising an optical imaging system according to claim 1, wherein the projection objective is a microlithography projection objective.

13. A projection exposure apparatus, comprising:
an illumination system; and
a projection objective comprising an optical imaging system according to claim 1,
wherein the projection exposure apparatus is a microlithography projection exposure apparatus.

14. The projection exposure apparatus of claim 13, wherein a mirror of the optical imaging system having a largest angle of incidence range has a phase optimized layer arrangement in which, for each angle of incidence of the angle of incidence interval, a relative average phase for each wavelength within the wavelength bandwidth deviates by a maximum of 25° from a relative average phase at the main wavelength.

15. The projection exposure apparatus of claim 13, wherein only a mirror of the optical imaging system having a largest angle of incidence range has a phase optimized layer arrangement in which, for each angle of incidence of the angle of incidence interval, a relative average phase for each wavelength within the wavelength bandwidth deviates by a maximum of 25° from a relative average phase at the main wavelength.

16. The projection exposure apparatus of claim 13, wherein a mirror of the optical imaging system having a maximum angle of incidence of at least 22° and at which the angle of incidence range has a bandwidth of at least 10° has a phase optimized layer arrangement in which, for each angle of incidence of the angle of incidence interval, a relative average phase for each wavelength within the wavelength bandwidth deviates by a maximum of 25° from a relative average phase at the main wavelength.

17. The projection exposure apparatus of claim 13, wherein the imaging system comprises an even number of mirrors.

18. The projection exposure apparatus of claim 13, wherein the optical imaging system comprises exactly six mirrors.

19. A method of using a microlithography projection exposure apparatus comprising an illumination system and a projection objective, the method comprising:
using the illumination system to illuminate a reticle; and
using the projection objective to project an image of the reticle onto a wafer, the projection objective comprising an optical imaging system according to claim 1.

20. The optical imaging system of claim 1, wherein the plurality of mirrors comprises at least six mirrors, and the at least one mirror is the fifth mirror in the beam path between the object plane and the image plane.

21. The optical imaging system of claim 20, wherein the fifth mirror in the beam path between the object plane and the image plan has a largest angle of incidence range.

22. The optical imaging system of claim 21, wherein only the fifth mirror in the beam path between the object plane and the image plan has a phase optimized layer arrangement in which, for each angle of incidence of the angle of incidence interval, the relative average phase for each wavelength within the wavelength bandwidth deviates by a maximum of 25° from the relative average phase at the main wavelength.

23. The optical imaging system of claim 22, wherein the fifth mirror in the beam path between the object plane and the image plan has a maximum angle of incidence of at least 22°.

24. The optical imaging system of claim 20, wherein only the fifth mirror in the beam path between the object plane and the image plan has a phase optimized layer arrangement in which, for each angle of incidence of the angle of incidence interval, the relative average phase for each wavelength within the wavelength bandwidth deviates by a maximum of 25° from the relative average phase at the main wavelength.

25. The optical imaging system of claim 24, wherein the fifth mirror in the beam path between the object plane and the image plan has a maximum angle of incidence of at least 22°.

26. The optical imaging system of claim 20, wherein the fifth mirror in the beam path between the object plane and the image plan has a maximum angle of incidence of at least 22°.

27. The optical imaging system of claim 1, wherein the phase optimized layer arrangement is designed so that a variation of the average phase <PHI> with the angle of incidence AOI has an approximately parabolic profile.

28. An optical imaging system configured to image a pattern arranged in an object plane of the imaging system into an image plane of the imaging system via electromagnetic radiation having a wavelength range around a main wavelength $\lambda_0$, the optical system comprising:
a plurality of mirrors,
wherein:
each mirror has a mirror surface comprising a reflective layer arrangement having a sequence of individual layers;
each mirror surface is arranged in a beam path between the object plane and the image plane so that, during use of the optical imaging system, each reflective layer arrangement is irradiated from an angle of incidence range characteristic of the mirror and to generate an average phase <PHI>(AOI)=$(PHI_p+PHI_s)/2$ for each ray impinging at an angle of incidence AOI, where $PHI_p$ is a phase for a p polarized radiation component and $PHI_s$ is a phase for an s polarized radiation component;

the wavelength range has a wavelength bandwidth $\Delta\lambda$ of at least 0.25 nm measured between a lower secondary wavelength $\lambda_{min} < \lambda_0$ and an upper secondary wavelength $\lambda_{max} < \lambda_0$;

at least one mirror has an angle of incidence interval of more than 8° and also has a phase optimized layer arrangement in which, for each angle of incidence of the angle of incidence interval, a relative average phase for each wavelength within the wavelength bandwidth deviates by a maximum of 25° from a relative average phase at the main wavelength the phase optimized layer arrangement is designed so that a variation of the average phase <PHI> with the angle of incidence AOI has an approximately parabolic profile; and the average phase in the angle of incidence range deviates less than 20% from a directrix $<PHI>_{REL} = MPV/(AOImax - AOImin)^k \cdot (AOI - AOImin)^k$, where k is between 1.1 and 2.2, MPV denotes a PV value of the average phase, the PV value is averaged over the wavelengths, AOImin and AOImax denote a smallest and a largest angle of incidence, respectively, of the angle of incidence interval considered, and $<PHI>_{REL}$ is the relative average phase $<PHI>_{AOI} - <PHI>_{AOImin}$.

* * * * *

UNITED STATES PATENT AND TRADEMARK OFFICE
CERTIFICATE OF CORRECTION

PATENT NO. : 9,188,771 B2
APPLICATION NO. : 13/313641
DATED : November 17, 2015
INVENTOR(S) : Aurelian Dodoc et al.

It is certified that error appears in the above-identified patent and that said Letters Patent is hereby corrected as shown below:

Specification

Col. 1, line 7, delete "10 61/420,882," and insert -- 61/420,882, --.

Col. 5, line 26, delete "λmax" and insert -- $\lambda_{max}$ --.

Col. 8, line 8, delete "(non-rotationaly" and insert -- (non-rotationally --.

Col. 8, line 35, delete "$z = \dfrac{h^2/RDY}{1+\sqrt{1-(CCY)h^2/RDY^2}}$" and insert -- $z = \dfrac{h^2/RDY}{1+\sqrt{1-(1+CCY)h^2/RDY^2}}$ --.

Col. 8, line 52, delete "$z_F \sum_{i=0}^{n}\sum_{j=0}^{n} a_{i,j}x^i y^j$" and insert -- $z_F = \sum_{i=0}^{n}\sum_{j=0}^{n} a_{i,j}x^i y^j$ --.

Col. 11, line 18, delete "alfa," and insert -- alia, --.

Col. 11, line 34, delete "APO = (Ru max Ru min)/Ru mean." and insert -- APO = (Ru max Ru min)/Ru mean --.

Col. 14, line 67, delete "λmax" and insert -- $\lambda_{max}$ --.

Col. 15, line 64, delete "λmin" and insert -- $\lambda_{min}$ --.

Col. 15, line 65, delete "λmax" and insert -- $\lambda_{max}$ --.

Claims

Col. 17, line 22, Claim 7, delete "form" and insert -- from --.

Col. 18, line 23, Claim 21, delete "plan" and insert -- plane --.

Signed and Sealed this
Twelfth Day of July, 2016

Michelle K. Lee
*Director of the United States Patent and Trademark Office*